US007282254B1

(12) United States Patent
Cho et al.

(10) Patent No.: US 7,282,254 B1
(45) Date of Patent: Oct. 16, 2007

(54) SURFACE COATING FOR ELECTRONIC SYSTEMS

(75) Inventors: Junghyun Cho, Johnson City, NY (US); Scott Oliver, Endwell, NY (US); Wayne Jones, Vestal, NY (US); Bahgat Sammakia, Binghamton, NY (US)

(73) Assignee: The Research Foundation of State University of New York, Binghamton, NY (US)

( * ) Notice: Subject to any disclaimer, the term of this patent is extended or adjusted under 35 U.S.C. 154(b) by 108 days.

(21) Appl. No.: 10/785,887

(22) Filed: Feb. 23, 2004

(51) Int. Cl.
*B32B 3/10* (2006.01)
*B32B 9/04* (2006.01)
*B32B 18/00* (2006.01)
*B32B 27/00* (2006.01)

(52) U.S. Cl. .................. 428/195.1; 428/201; 428/338; 428/702

(58) Field of Classification Search ............... 428/338, 428/420, 446, 702, 195.1, 201
See application file for complete search history.

(56) References Cited

U.S. PATENT DOCUMENTS 5,352,485 A * 10/1994 DeGuire et al. ............ 427/226

OTHER PUBLICATIONS

Bishop et al., Self-Assembled Monolayers: Recent Developments and Applications, Current Opinion in Colloid & Interface Science, 1996, 1, pp. 127-136.
Ulman, Formation and Structure of Self-Assembled Monoloayers, Chemical Rev., 1996, 96, pp. 1533-1554.
Mallouk et al., Ultrathin Films Based on Layered Materials, Compr. Supra. Chem., 1996, pp. 189-217.
Sarno et al., Multi-Layer Metalloporphyrin Polymers Separated by Bidentate Lewis Base Derivatives on Glass Substrates, Polymer PrePrints, 1998, p. 1101.
Sarno et al., Self-Assembled Molecular Architectures on Surfaces: New Strategies Involving Metal-Organic Copolymers, Langmuir 2000, 16, pp. 6191-6199.
Sarno et al., Self-Assembly of Ruthenium Porphyrins Into Monolayer and Multilayer Architectures Via Heterogeneous Coordination Chemistry, Mat. Res. Soc. Symp. Proc., vol. 648, 2001, P6.27.1-P6.28.6.
Sarno et al., X-Ray Photoelectron Spectroscopy as a Probe of Intermolecular Interactions in Porphyrin Polymer Thin Films, Inorg. Chem., 2001, 40, pp. 6308-6315.
Hohnholz et al., Uniform Thin Films of Poly-3,4-Dioxythiophene (PEDOT) Films Prepared by In-Situ Deposition, Chem. Comm., 2001, pp. 2444-2445.
Yitzchaik et al., Chromophoric Self-Assembled Superlattices, Acc. Chem. Res., 1996, 29, pp. 197-202.
Lander et al., Friction and Wear of Surface-Immobilized C60 Monolayers, Chem. Mater, 1995, 7, pp. 1437-1439.
Kho et al., Boron-Rich Boron Nitride (BN) Films Prepared by a Single Spin-Coating Process of a Polymeric Precursor, Thin Solid Films, 2001, 389, pp. 78-83.
Maboudian, Surface Process in MEMS Technology, Surface Science Reports, 1998, 30, pp. 207-269.

* cited by examiner

*Primary Examiner*—Ramsey Zacharia
(74) *Attorney, Agent, or Firm*—Milde & Hoffberg LLP

(57) ABSTRACT

A bi- or multi-layer coating is deposited upon a substrate using a low temperature process. The bi-layer is a lower layer of a SAM coating, which is overlaid with a hard coating. The hard coating can be made of materials such as: polymer, $Si_3N_4$, BN, TiN, $SiO_2$, $Al_2O_3$, $ZrO_2$, YSZ, and other ceramic materials, and the underlying, compliant, SAM coating can comprise substances containing long chain molecules that chemically bond to the substrate. This bi-layer provides both environmental and hermetical protection to electronic hardware and MEMS systems, without employing expensive packaging materials and processes. Multiple bi-layers may be combined to form multi-layer coatings. A protective polymer or other material may optionally be formed as an outside layer.

39 Claims, 7 Drawing Sheets

SURFACE COATING FOR ELECTRONIC SYSTEMS

FIELD OF THE INVENTION

The invention relates to surface coatings for electronic hardware and, more particularly, to a multi-layered surface coating comprising an upper ceramic layer and a lower, self-assembled monolayer (SAM) for protecting micro-electromechanical systems (MEMS).

BACKGROUND OF THE INVENTION

Recent developments in silicon micro-electromechanical systems (MEMS) have dramatically reduced length scales of these components, resulting in an increase in surface area-to-volume ratios of these structures. The new, small dimensions tend to cause the MEMS structures to adhere (stiction) to the substrate or adjacent structures in the presence of moisture. In addition, since the structures have surfaces in normal or sliding contact, friction and wear are also crucially affected. Therefore, surface modifications are necessary to improve anti-stiction and wear resistance of these silicon-based structures.

Self-assembled monolayer (SAM) coatings and thin vapor-deposited organic coatings have frequently been utilized to improve anti-stiction. Organic coatings, however, are not only prone to rapid wear over long-term use, they also significantly degrade in harsh environments or at elevated temperatures.

The present invention uses ceramic coatings for MEMS devices. Ceramics provide the protection necessary for MEMS surfaces, but they impose a fabricating challenge. One difficulty is that conventional ceramic processing cannot be easily implemented for surface coatings because it involves high processing temperatures. This is so even when sol-gel processing is used.

Many MEMS devices cannot tolerate the ceramic processing temperature range. Spalling will take place from the surface of the MEMS devices due to thermo-mechanical stresses, thermal shock, and high temperature fluctuation. The protection layer will then become ineffective.

In addition, some IC and MEMS devices require hermetic packaging for long-term reliability. Hermetic packaging, in general, utilizes ceramic materials that are deposited upon the surface in an inert atmosphere or vacuum.

Ceramic hermetic packages effectively protect the device from oxygen and water permeation, but manufacturing and material costs are high. The packaging content can be as high as 75% to 95% of the overall cost of a MEMS device.

Therefore, it would be a significant advance in MEMS technology to be able to use conventional packaging processes with ceramic coatings that may provide hermetic packages without loosing any benefits of hermetic encapsulation.

The present invention provides a bi- or multi-layer coating for MEMS surfaces. The multi-layer consists of at least one layer comprising a top, hard coating (e.g., ceramics such as BN, TiN, $Al_2O_3$, and $ZrO_2$), and an underlying, compliant SAM coating (organic materials) for silicon and organic materials. This multi-layer coating provides both environmental and hermetical protection without employing expensive packaging materials and processes.

The inventive ceramic coatings are fabricated using a low-temperature synthesis having a minimum of shrinkage during processing. The application can use a solution precursor method. In fact, inorganic films can be grown as well upon organic substances, as is routinely observed in nature (this is known as "biomimetic" processing). The self-assembled monolayer (SAM) can be used for this organic template layer and for the subsequent ceramic growth. This fabrication is unique because ceramic film, which usually does not grow well upon bare silicon surfaces, can do so on a SAM-coated surface. The coating may consist of a single bi-layer SAM/ceramic or, in alternate embodiments, multiple layers may be used.

The thermal stability of the underlying SAM coating will also be improved by the top ceramic coating, which will prevent SAM oxidation at elevated temperatures. The ceramic layer will also offer ideal thermal protection. Furthermore, the SAM coating will act as a buffer layer for the top ceramic layer to prevent it from cracking or debonding during processing, as well as during device operation. It has been shown through computer simulation that the stress in the ceramic film is in fact relieved when the thickness of a buffer layer is increased.

The multi-layer approach maximizes the strengths of both the organic and inorganic coating functions, while self-compensating for the inherent weaknesses of each. The resultant coating provides a synergy by functioning better than the two layers alone.

Another advantage of the SAM coating resides in the ceramic/SAM bi-layer(s). This layer can be selectively deposited only on the surfaces to be protected, thus leaving the electrical components intact for the subsequent interconnections. An additional SAM coating on metallic bonding pads is grown for this purpose using a solution route prior to the deposition of ceramic coatings. The second SAM coatings are inert, keeping the ceramic layer from growing on the metal surface. In this way, the ceramic/SAM layers will be deposited selectively on the silicon surfaces. More importantly, the protective coating with hard top overlay will improve a variety of MEMS applications, including bio-MEMS, which are used in medical and biological applications.

As aforementioned, the ceramic/SAM coatings applied to organic (plastic) packaging components will protect the device from adverse environments, which normally require ceramic hermetic packaging. It will also provide enhanced thermal stability for the organic packages, which are normally and rapidly degraded at elevated temperatures in air and harsh environments. Owing to the fact that the coating process only adds additional solution dipping processes (i.e., steps), the manufacturing costs will be much cheaper than the normally used hermetic packaging processes, which typically require expensive vacuum equipment and raw materials.

In the present inventive coating processes, the entire package is simply dipped into a precursor solution, dried, and pyrolyzed for each SAM and ceramic coating. The processing temperature is low (<300° C.). By using a selective coating process, only the organic surfaces will be coated with a SAM and ceramic layer. This will not cover metal surfaces.

SUMMARY OF THE INVENTION

In accordance with the present invention, a bi- or multi-layer coating for MEMS surfaces is disclosed. The multi-layer consists of a top, hard coating (e.g., ceramics such as BN, TiN, $Al_2O_3$, and $ZrO_2$), and an underlying, compliant, self-assembly monolayer (SAM) coating for silicon and organic materials. These bi- or multi-layer coatings provide both environmental and hermetical protection without employing expensive packaging materials and processes. The MEMS packages are simply dipped into a precursor solution, dried, and pyrolyzed for each SAM and ceramic coating layer. The processing temperature is low, typically <300° C. By using a selective coating process, only the organic surfaces will be coated with a SAM and ceramic layer, leaving metallic areas free from coating.

It is an object of the present invention to provide improved coatings for electronic hardware.

It is another object of this invention to provide a bi- or multi-layer coating for MEMS surfaces that provides both environmental and hermetical protection without employing expensive packaging materials and processes.

BRIEF DESCRIPTION OF THE DRAWINGS

A complete understanding of the present invention may be obtained by reference to the accompanying drawings, when considered in conjunction with the subsequent detailed description, in which.

DESCRIPTION OF THE PREFERRED EMBODIMENT

Generally speaking, a bi-layer coating is deposited upon a substrate. The bi-layer comprises a lower layer of a SAM coating, which is overlaid with a hard ceramic coating. The hard ceramic coating can comprise materials such as: BN, TiN, $Al_2O_3$, and $ZrO_2$. The underlying compliant SAM coating can comprise substances containing long chain molecules that chemisorb onto a substrate. This bi-layer provides both environmental and hermetical protection to the electronic hardware without employing expensive packaging materials and processes.

Figure 1:
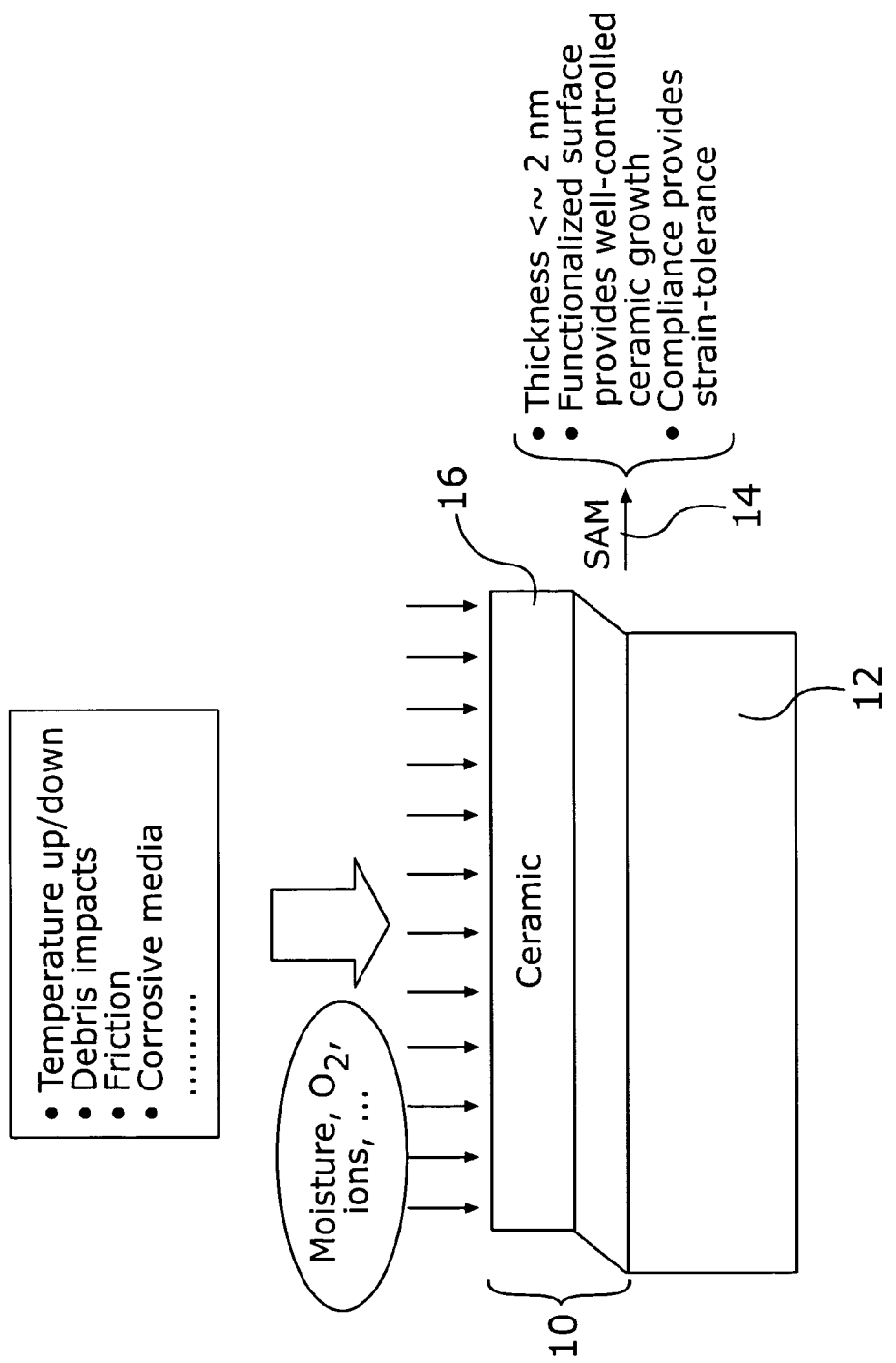
FIG. 1 illustrates a schematic view of a bi-layer coating of the invention.

Now referring to FIG. 1, a bi-layer coating 10 is shown deposited upon a substrate 12. The bi-layer comprises a lower layer of a SAM coating 14, which is overlaid with a hard, ceramic coating 16. The hard top coating can be an oxide, a nitride, or an insulating polymer. The oxide and nitride coating can be selected from a group of materials consisting of yttrium stabilized zirconia (YSZ), $ZrO_2$, $Al_2O_3$, $SiO_2$, AlMgO, NiFeO, indium oxide, tin oxide, indium tin oxide, YBaCuO, BiSrCaCuO, LaSrMnO, NIO, CuO, FeAlO, BN, TiN, AlN, FeAlN, and combinations thereof. The underlying, compliant SAM coating can comprise substances containing long chain molecules that chemisorb onto a substrate. It will be recognized by those of skill in the materials coating arts that the thickness of each layer may be controlled (i.e., tuned) to meet a particular operating circumstance or environment.

Figure 2:
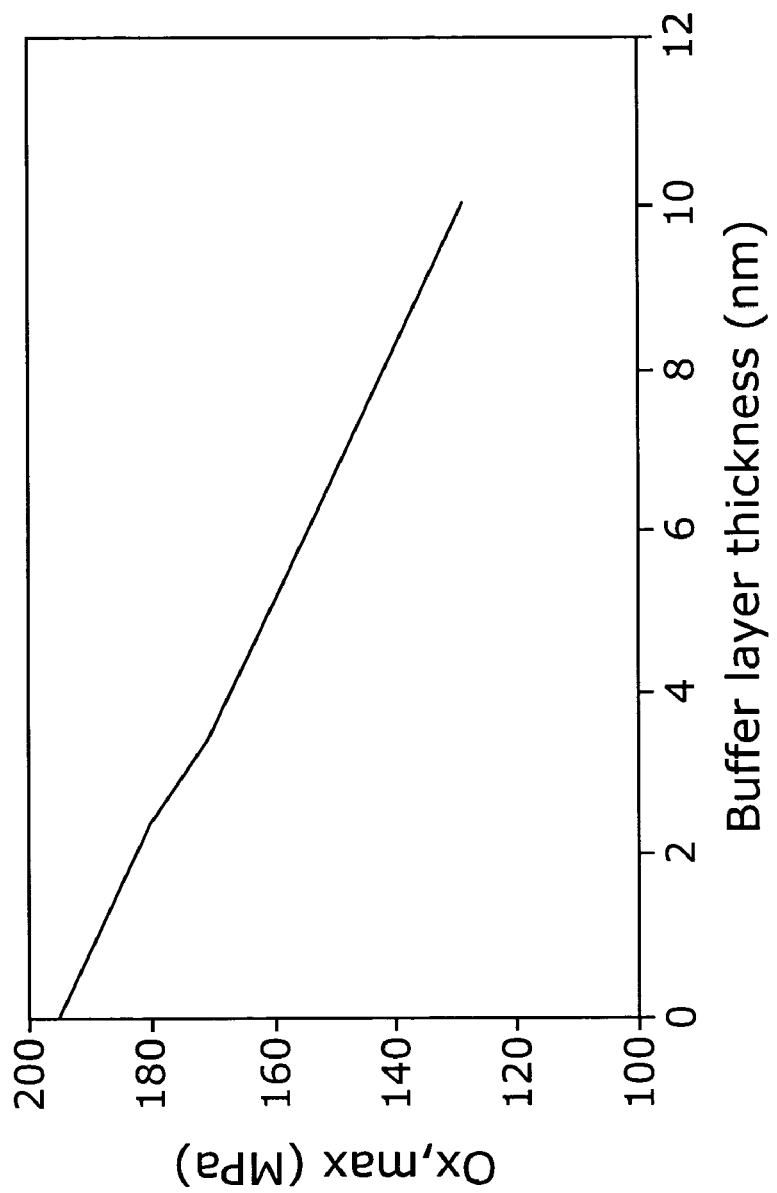
FIG. 2 depicts a graphic view of a stress plot for the cooling bi-layer coating shown in FIG. 1.

Now referring to FIG. 2, a bi-layer stress simulation plot is illustrated, as the coating is cooled from 200° C., to 20° C., using a low temperature synthesis, where the SAM coating 14 is used as an organic template for the ceramic layer 16, as shown in FIG. 1. Thermal stability of the underlying SAM coating 14 is improved by the top ceramic layer 16. The ceramic layer 16 will prevent oxidation of the SAM layer 14, and the SAM layer 14 will act as a buffer layer for the ceramic layer 16 to prevent it from cracking or debonding.

Figure 3:
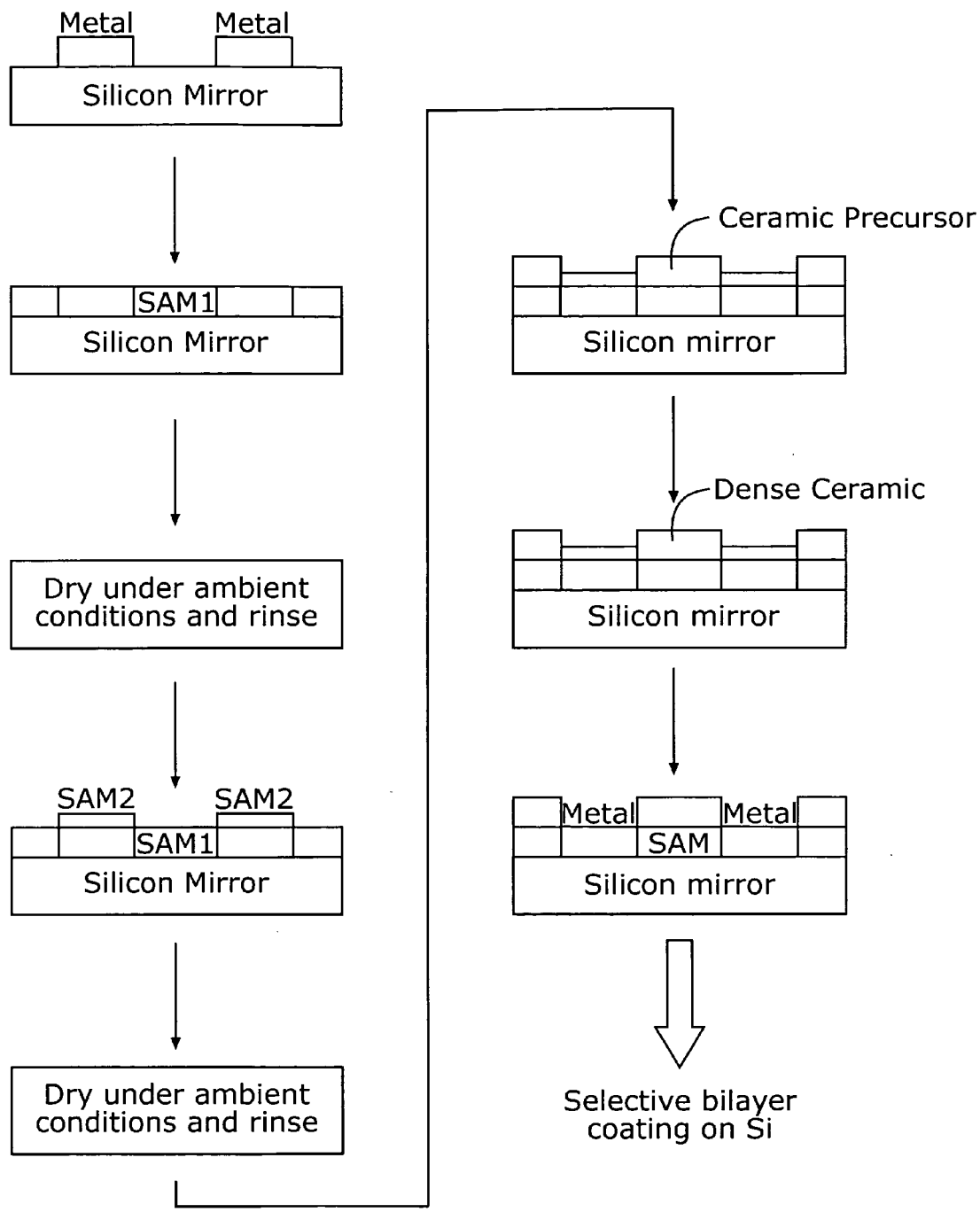
FIG. 3 illustrates a schematic flow chart for a method of applying SAM and ceramic bi-layers on a silicon mirror using a solution technique.

Referring to FIG. 3, a schematic flow chart is depicted of the method of applying SAM and ceramic bi-layers on a silicon mirror, using a solution technique. The entire packages are simply dipped into a precursor solution, dried, and pyrolyzed for each SAM and ceramic coating. The thickness of the coating may be varied or tuned to achieve the desired properties by repeating one or more of the steps shown in FIG. 3. Alternately, dipping time may be adjusted to obtain a desired thickness for a particular layer. The processing temperature is low (<300° C.). It will be observed that none of the metal surfaces are coated since the temporary, inert "SAM2" surfaces protect them from coating.

Synthesis of Bi-Layer Coatings

Figure 4:
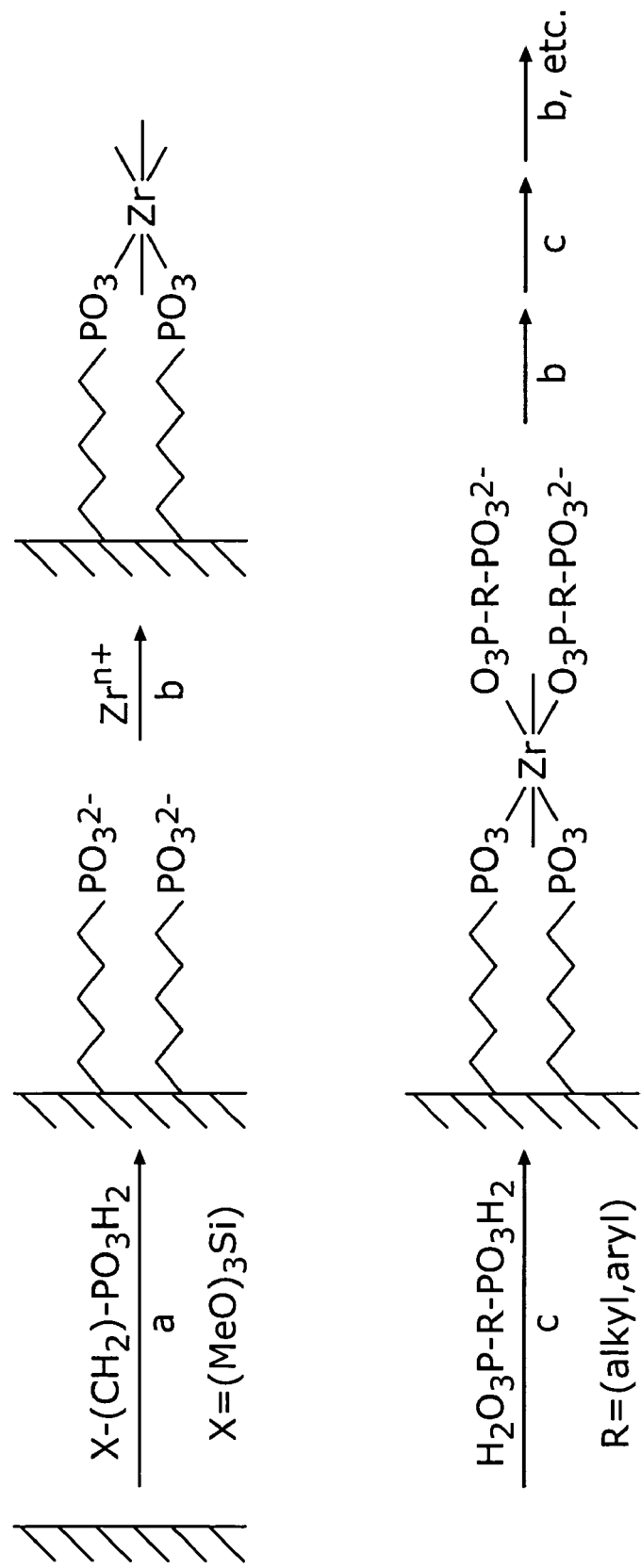
FIG. 4 depicts three separate steps depicting phosphonate- or zirconium-terminated SAM reactions used in subsequent YSZ growth.

Self-assembled monolayers (SAMs) are well-ordered arrays of long-chain molecules that chemisorb onto a substrate one molecule thick as shown in FIG. 4, Step a (A. R. Bishop, R. G. Nuzzo, "Self-assembled monolayers: Recent developments and applications," Curr. Opin. Col. Int. Sci. 1996, 1, 127-136; A. Ulman, "Formation and Structure of Self-Assembled Monolayers," Chem. Rev. 1996, 96, 1533-1554).

One requirement of SAM formation is a chemical interaction between the substrate and surface-active head-group of the adsorbate. The monolayer is deposited by immersion of the substrate into a dilute, milli-molar solution of these molecules. Under ambient conditions, the molecules arrange themselves into densely packed monolayers usually within several minutes to hours. One of the most extensively studied SAM systems is alkyltricholorosilanes on glass. Under a dry atmosphere, the controlled hydrolysis and condensation of the Si—Cl or Si—O—R groups occurs, with surface hydroxyls leading to complete substrate coverage (Bishop, ibid.; Ulman, ibid.; T. E. Mallouk, H.-N. Kim, P. J. Ollivier, S. W. Keller, "Ultrathin Films Based on Layered Materials," Compr. Supra. Chem. 1996, 7, 189-217; D. M. Sarno, D. Grosfeld, J. Snyder, B. Jiang, W. E. Jones, Jr., "Multi-Layer Metalloporphyrin Polymers Separated by Bidentate Lewis Base Derivatives on Glass Substrates," Polymer Pre-prints 1998, 1101; D. M. Sarno, B. Jiang, D. Grosfeld, J. Afriyie, L. J. Matienzo, W. E. Jones, Jr., "Self-Assembled Molecular Architectures: New Strategies Involving Metal-Organic Co-Polymers," Langmuir 2000, 16, 6191-6199; D. M. Sarno, L. J. Matienzo, W. E. Jones Jr., "Self-Assembly of Ruthenium Porphyrins into Monolayer and Multi-layer Architectures via Heterogeneous Coordination Chemistry," Mat. Res. Soc. Proc. 2001, 6281; D. M. Sarno, L. J. Matienzo, W. E. Jones Jr., "X-Ray Photoelectron Spectroscopy as a Probe of Intermolecular Interactions in Porphyrin Polymer Thin Films," Inorg. Chem. 2001, 40, 6308-6315; D. Hohnholz, A. G. MacDiarmid, D. M. Sarno, W. E. Jones, Jr., "Uniform thin films of poly-3,4-ethylenedioxythiophene (PEDOT) prepared by in-situ deposition," Chem. Commun. 2001, 2444-2445).

An alkyltricholorosilane or alkyltrimethoxysilane SAM is deposited (FIG. 4, Step a) on the native oxide layer of silicon wafers. The organic monolayer is then coated with an inorganic ceramic material, through a low-temperature aqueous solution method or prepolymer method. There is now extensive literature on the chemical choice of the SAM terminus (Bishop, ibid.; Ulman, ibid.; Mallouk, ibid., Sarno, Grosfeld, ibid.; Sarno, Jiang, ibid.; Sarno, Matienzo, ibid.; Sarno, Matienzo, Jones, ibid.; Hohnholz, ibid.; S. Yitzchail, T. J. Marks, "Chromophoric Self-Assembled Superlattices," Acc. Chem. Res. 1996, 29, 197-202).

The terminus can be chosen prior to SAM deposition (via a suitable amphiphile), or subsequent to SAM deposition (terminus conversion). Therefore, there are a wide variety of possible pathways by which one can create a SAM-ceramic bi-layer coating. Several examples follow.

Yttrium-Stabilized Zirconia (YSZ) on a Phosphonate SAM

As previously discussed, YSZ is an ideal ceramic material for wafer coating. An extensively studied class of self-assembled multilayers is based on α-zirconium phosphonate, a previously well-known layered inorganic material. One attractive feature of this sequence of self-assembly reactions (FIG. 4, Step a) is that one could, in principle, use any one of the steps to initiate growth of YSZ: the phosphonate-(Step b) or the zirconium-terminated film (Step c) could be used as the SAM-YSZ interface. The former would perhaps be better in terms of allowing the correct spacing of zirconiums for the growing YSZ phase.

The YSZ film may be grown by sol-gel methods at temperatures below 300° C. The standard precursors are ziriconium sulfate, zirconium acetate (or zirconyl chloride) and yttrium nitrate hydrate. Another appealing aspect of this system is that SAM thickness may be controlled by carrying out additional steps b and c, resulting in multilayers, as shown in FIG. 4. The ellipsometry determined thickness scales linearly with the number of layers added, and hundreds of layers can be deposited. Alkyl chain length is another degree of freedom.

Both of these features would be expected to influence the stability and expansion properties of the SAM coating. It is also worth noting that while the solid particle of bulk phase α-zirconium phosphonate contains many defects, this ordered film—based on a 2D, layered inorganic material—may be more forgiving of substrate, SAM, and YSZ defects.

Nitride Ceramics on an Azide SAM

Figure 6:
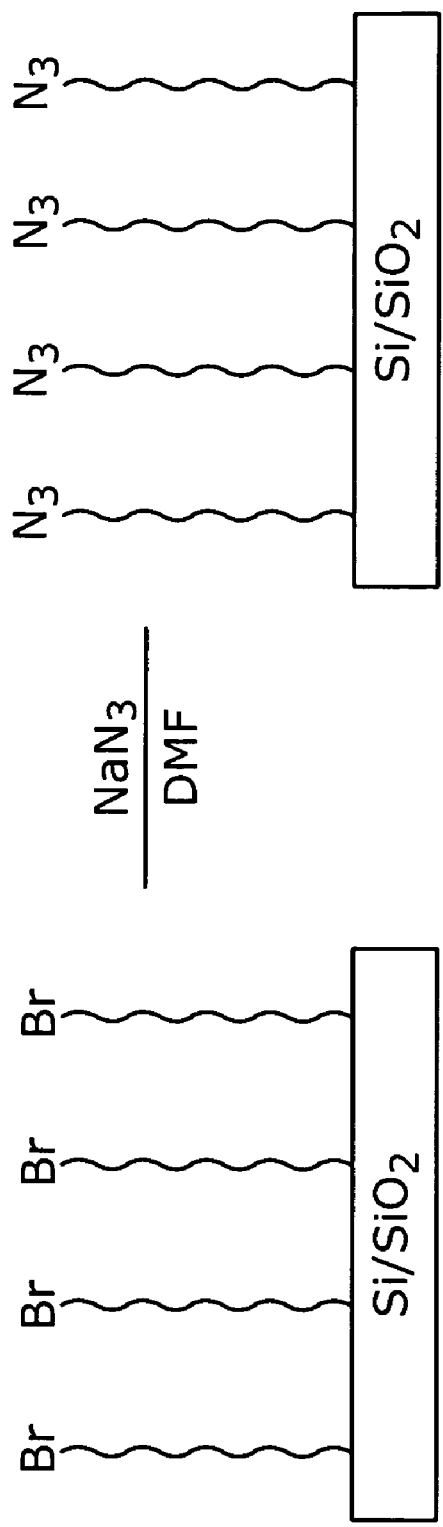
FIG. 6 shows a chemical process for growing an azide-terminated SAM.

A second proposed bilayer combination begins with a bromide-terminated SAM (FIG. 6). The surface is easily converted to an azide (L. M. Lander, W. J. Brittain, V. A. DePalma, S. R. Girolmo, "Friction and Wear of Surface-Immobilized C60 Monolayers," Chem. Mater. 1995, 7, 1437-1439), which is used to anchor $C_{60}$, In the present case, the azide surface should be ready to initiate nitride ceramic growth. For example, one can use the polymer precursor method described by Kho et al. for the deposition of smooth, crack-free boron nitride films (J.-G. Kho, K.-T. Moon, G. Nouet, P. Ruterana, D.-P. Kim, "Boron-rich boron nitride (BN) films prepared by a single spin-coating process of a polymeric precursor," Thin Solid Films 2001, 389, 78-83).

The prepolymer is synthesized from ammonium sulfate and sodium tetrahydroborate, dissolved in tetrahydrofuran (THF), spin-coated and pyrolyzed at 900° C. The substrate can then be dip coated into this solution and gently heated (<350° C.) in order to maintain the integrity of the SAM (R. Maboudian, "Surface Processes in MEMS Technology," Surf. Sci. Reports 1998, 30, 209-268). The resultant quasi-crystalline or amorphous boron nitride films will still have the desired properties of thermal and electrical insulation. One could also study other nitride ceramics, such as those of titanium or silicon.

Thermally Insulating Polymer Coatings on Hydroxy SAMs

Another strategy is to replace the ceramic with a thermally resistant polymer, such an epoxy or a phosphorus-based polyimide. These materials are low cost, highly processable, and may be polymerized in-situ on suitably modified substrate surfaces (D. Hohnholz, ibid.). A hydroxy-terminated SAM, for instance, is a likely candidate for epoxy deposition. This type of monolayer may be synthesized by way of a methyl ester terminated alkyltrichlorosilane $(CH_3CO_2CH_2)_nSiCl_3$, n=8 to 18). The ester is reduced to an alcohol with $LiAlH_4$(Ulman, ibid.).

Again, self-assembled multilayers may be grown prior to the polymer layer. The hydroxy-terminated SAM surface resembles glass, or the native oxide layer of a silicon wafer, allowing assembly of additional monolayers of the methyl ester alkyltrichlorosilane (Ulman, ibid.). An added benefit of this reaction is that each monolayer is connected by a highly stable 2D siloxane network.

Mixed SAMs for Area-Specific Bilayer Growth

Finally, it is worth noting that one can use basic SAM chemistry to deposit the bi-layers only on desired areas. The metallic bonding pads that connect the MEMS components can easily be protected by an inert alkanethiol SAM (Bishop, ibid.; Ulman, ibid.; Mallouk, ibid). This layer can be grown either before or after the alkyltricholorosilane SAM, since each is specific for metallic pad and Si substrate, respectively. The ceramic should preferentially grow on the alkyltrichlorosilane areas, where the correct SAM functionality exists, while the methyl caps of the alkanethiol SAM deter ceramic growth. The alkanethiol SAM of the metallic layer could easily be chemically or photochemically etched after the process, since it would not possess a ceramic protective coating.

The properties of the bi-layer coatings of this invention are compared with only SAM and ceramic coating, respectively, in Table 1. Note that bio stability is provided by using selected ceramic materials. The choice of appropriate ceramic materials would minimize film formation in devices used in bio-medical applications.

TABLE 1

Property comparison among different coating schemes

| Properties | Organic SAM Coatings | Ceramic Coatings | Organic + Top Ceramic Coatings |
|---|---|---|---|
| Transparency | 3 | 2.5 | 2 |
| Protection from moisture/ion permeation | 1 | 3 | 3 |
| Wear-resistance | 1 | 3 | 3 |
| Thermal stability | 1 | 3 | 3 |
| Thermal insulation | 1 | 3 | 2 |
| Stress-free film | 3 | 1 | 3 |
| Strain-tolerance during thermal cycling | 3 | 1 | 3 |
| Anti-stiction | 3 | 2 | 2 |
| Shelf-life (extended storage) | 1 | 3 | 3 |
| Ease of cleaning with solvents and chemicals | 1 | 3 | 3 |
| Conformal coating | 3 | 1.5 | 3(?) |
| Hermetic packaging | Required | Not required | Not required |
| Bio Stability | 1 | 3 | 3 |

(3:better, 2:good, 1:poor)

Note that the data shown in Table 1 supports using a bi-layer coating methodology to improve properties such as protection from moisture and/or ion formation, wear resistance, thermal stability, mechanical stress reduction, anti-stiction, shelf life extension, ease of cleaning with solvents, conformal coatings, hermetic packaging, and biologically stable films that resist bio-film formation.

Figure 5A:
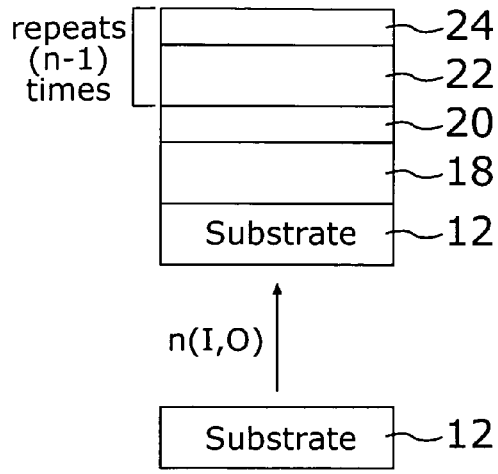
FIGS. 5a-5d are sectional schematic diagrams of four multi-layer configurations.
Figure 5B:
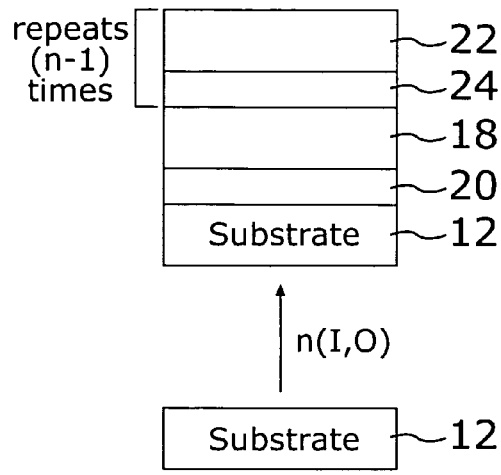
Figure 5C:
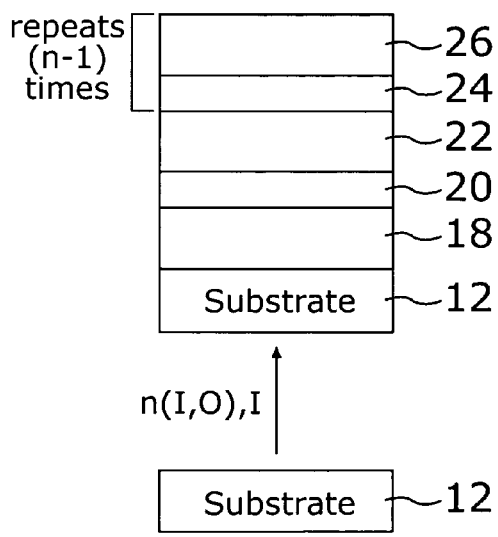

While a bi-layer configuration has been used extensively herein for purposes of disclosure, the bi-layer concept may be expanded into a generalized multi-layer approach. It will be recognized to those of skill in the art that the inventive approach of selectively forming a SAM layer and then pyrolizing a ceramic overlayer may be repeated any number of times to form multi-layer configurations. Four such configurations are shown in FIGS. 5a-5c. FIG. 5a shows a configuration wherein substrate 12 is coated first with an inorganic layer 18 (typically a ceramic as described hereinabove). Next an organic layer 20 (i.e., a SAM) is coated followed by, in order, another inorganic layer 22 and a final SAM layer 24. It will be noted that layers 22, 24 may be repeated n−1 times where n represents the total number of composite organic/inorganic layers formed on substrate 12.

FIG. 5b shows a second multi-layer configuration wherein substrate 20 is first coated with an organic layer 20 and which is then overcoated with an inorganic layer 18. An additional organic layer 24 followed by an inorganic layer 22 is added. As in the configuration of FIG. 5a, the final layer 22, 24 may be repeated n−1 times.

Figure 5D:
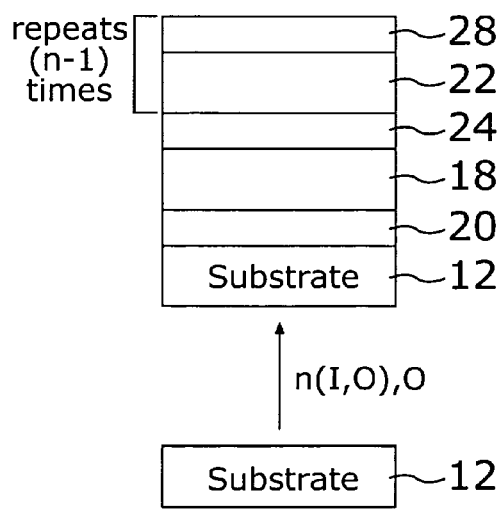

FIGS. 5c and 5d show configurations similar to those of FIGS. 5a and 5b, respectively. However, after the final layer have been added to the configurations of FIGS. 5a and 5b, a final inorganic layer 26 is added to the configuration of FIG. 5c and a final organic layer 28 is added to the configuration of FIG. 5d.

It will be recognized that many other multi-layer configuration may be formed from pairs of organic/inorganic materials. Consequently, the invention is not considered limited to those configurations chosen for purposes of disclosure.

Figure 7A:
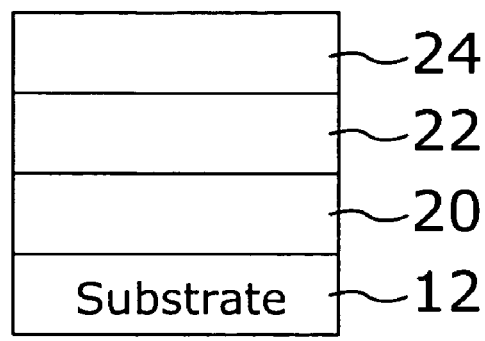
FIGS. 7a and 7b show tri-layer coatings of organic-ceramic-organic layers and ceramic-organic-ceramic constructions, respectively.
Figure 7B:
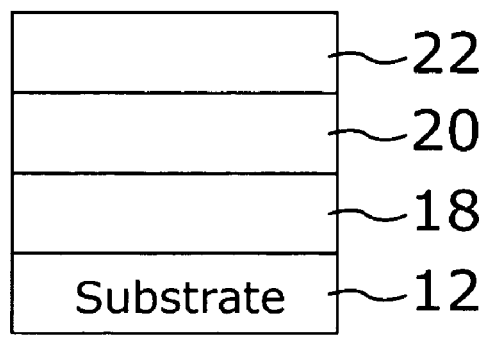

Tri-layer coatings comprising either organic-ceramic-organic layers or ceramic-organic-ceramic layers have also be found useful. These tri-layer coatings provide all protective advantages described hereinabove. FIGS. 7a and 7b show schematic representations of a substrate 12 overlaid with organic 20, ceramic 22, and organic 24 layers, and ceramic 18, organic 20, and ceramic 22 layers, respectively.

Since other modifications and changes varied to fit particular operating requirements and environments will be apparent to those skilled in the art, the invention is not considered limited to the example chosen for purposes of disclosure and covers all changes and modifications which do not constitute departures from the true spirit and scope of this invention.

Having thus described the invention, what is desired to be protected by Letters Patent is presented in the subsequently appended claims.

What is a claimed is:

1. A coating for electronic hardware and MEMS system substrates, said coating providing both environmental and hermetical protection to the electronic hardware and MEMS system substrates, said coating comprising an under-layer defining a Self-Assembly Monolayer (SAM), over which is overlaid an oxide layer coating, and wherein thermal stability of the SAM under-layer is improved by the oxide layer coating, and said oxide layer coating preventing oxidation of the SAM under-layer, and further wherein the SAM under-layer acts as a buffer layer for the oxide layer coating, wherein at least said oxide layer coating is selectively applied over a portion of the substrate, and a portion of the substrate is not coated with said oxide layer coating.

2. The coating for electronic hardware and MEMS system substrates in accordance with claim 1, wherein the SAM under-layer contains molecules that chemisorb onto said substrates.

3. A method of forming the coating for electronic hardware and MEMS substrates in accordance with claim 1, comprising the steps of:
  a) immersing the substrates into a dilute, milli-molar solution of molecules that adhere to only a portion of said substrate by selective chemical bonding to a portion of the exposed substrate having selected chemical properties under substantially ambient conditions, said molecules arranging themselves into densely-packed mono-layers within a time range of several minutes to hours; and then
  b) over layering said mono-layers of step (a) with a hard protective coating at a temperature of less than 300° C.

4. The method of forming a coating upon electronic hardware and MEMS substrates in accordance with claim 3, wherein said hard protective coating comprises a material that is selected from a group of materials consisting of one or more of: a ceramic material, an insulating polymer, $ZrO_2$, yttrium stabilized zirconia, silicon dioxide, AlMgO, NiFeO, indium oxide, tin oxide, indium tin oxide, YbaCuO, BiSrCaCuO, LaSrMnO, NiO, CuO, FeAlO, $Al_2O_3$, aluminum nitride, TiN, BN, $Si_3N_4$, FeAlN, and combinations thereof.

5. The coating for electronic hardware and MEMS system substrates, as recited in claim 1, wherein said coating provided at least one of: enhanced mechanical performance, improved wear resistance, improved erosion resistance, resistance to debonding of said ceramic coating, enhanced biocompatibility, improvers corrosion resistance, improved wetting, thermal insulation, thermal insulation, and electrical insulation to said electronic hardware and said MEMS systems substrates.

6. The coating for electronic hardware and MEMS system substrates, as recited in claim 1, wherein said coating is applied to at least one of: a silicon surface of an integrated circuit component, a polymer surface, a metal surface, and a biomaterial surface for said surface.

7. The coating for electronic hardware and MEMS system substrates, as recited in claim 6, wherein said coating is selectively applied to said surface leaving a portion of said surface uncoated.

8. The coating for electronic hardware and MEMS substrates, as recited in claim 7, wherein said surface comprises a surface to be protected comprising at least one of the surfaces: silicon (Si), metal oxide, and polymer, and said uncoated portion of said Si surface comprises a metallic bonding pads.

9. A bi-layered coating providing both environmental and hermetical protection to the electronic hardware and MEMS substrates, said bi-layer coating comprises: an oxide layer, and an under-layer comprising a Self-Assembly Monolayer (SAM), wherein the oxide layer is selectively deposited on a portion of the electronic hardware and MEMS substrates, and wherein at least a portion of the electronic hardware and MEMS substrates remains free of the oxide layer.

10. The bi-layered coating for electronic hardware and MEMS system substrates, said bi-layer providing both environmental and hermetical protection to the electronic hardware and MEMS system substrates as recited in claim 9, wherein said oxide layer and said SAM under-layer are formed in a process having a maximum temperature of less than 300° C.

11. A bi-layered coating for electronic hardware and MEMS system substrates, comprising:
   a) an organic underlayer, comprising well-ordered array of chemisorbed organic molecules on a substrate selected from the group electronic hardware, and a MEMS substrate; and
   b) a protective inorganic layer applied over said first organic under-layer, said protective inorganic layer being selected from the group: a ceramic material, an insulating polymer, $ZrO_2$, yttrium stabilized zirconia, silicon dioxide, AlMgO, NiFeO, indium oxide, tin oxide, indium tin oxide, YbaCuO, BiSrCaCuO, LaSrMnO, NiO, CuO, FeAlO, $Al_2O_3$, aluminum nitride, TiN, BN, $Si_3N_4$, FeAlN, and combinations thereof,
   wherein at least said protective inorganic layer is selectively applied over a portion of the substrate, and a portion of the substrate is not coated with said protective inorganic layer.

12. The bi-layered coating for electronic hardware and MEMS system substrates as recited in claim 11, wherein said protective inorganic layer comprises a metal oxide.

13. The bi-layered coating for electronic hardware and MEMS system substrates as recited in claim 11, wherein said organic underlayer is removable after application of at least said protective inorganic layer.

14. The bi-layered coating for electronic hardware and MEMS system substrates as recited in claim 11, wherein said organic underlayer comprises at least one selected from the group: a self-assembling monolayer (SAM) comprising molecules having a chain length of at least two, and a phosphonate self-assembling monolayer.

15. The bi-layered coating for electronic hardware and MEMS system substrates as recited in claim 11, wherein both of said organic underlayer and said protective inorganic layer are selectively applied, resulting in layer coverage of only a selected area.

16. A tri-layered coating for electronic hardware and MEMS system substrates, comprising:
   a) an under-layer selected from the group: a self-assembling chemisorbed organic layer, a thermally-resistant polymer layer, and an inorganic layer, applied to a substrate selected from the group electronic hardware, and a MEMS substrate;
   b) a second layer selected from the group: a self-assembling chemisorbed organic layer, a thermally-resistant polymer layer, and an inorganic layer, said second layer being a layer type different from said under-layer, said second layer being applied to said under-layer; and
   c) at least one additional layer selected from the group: a self-assembling chemisorbed organic layer, a thermally-resistant polymer layer, and an inorganic layer, applied atop said second layer,
   wherein at least one of said under-layer, said second layer, and said at least one additional layer comprises at least one selected from the group: a self-assembling monolayer (SAM) comprising molecules having a chain length of at least two, and a phosphonate self-assembling monolayer, and
   wherein at least one of said under-layer, said second layer, and said at least one additional layer comprises an inorganic layer, and a portion of the substrate being uncovered by any inorganic layer.

17. The tri-layered coating for electronic hardware and MEMS system substrates as recited in claim 16, wherein at least one of said under-layer, said second layer, and said at least one additional layer comprises at least one oxide selected from the group: $ZrO_2$, yttrium stabilized zirconia (YSZ), $SiO_2$, $Al_2O_3$, AlMgO, NiFeO, indium oxide, tin oxide, indium tin oxide, YBaCuO, BiSrCaCuO, LaSrMnO, NiO, CuO, FeAlO, aluminum nitride, TiN, BN, $Si_3N_4$, FeAlN, and combinations thereof.

18. The tri-layered coating for electronic hardware and MEMS system substrates as recited in claim 16, wherein a thermally-resistant polymer is provided as at least one of said under-layer, said second layer, and said at least one additional layer is polymerized in situ.

19. The tri-layered coating for electronic hardware and MEMS system substrates as recited in claim 16, wherein said under-layer is removable after application of at least said second layer.

20. A multi-layered coating for electronic hardware and MEMS system substrates, comprising:
   a) an under-layer selected from the group: an organic layer, and an inorganic layer, applied to electronic hardware or a MEMS substrate;
   b) a second layer selected from the group: an organic layer, and an inorganic layer, said second layer being the non-selected material of said first under-layer, said second layer being applied to said under-layer; and
   c) at least one additional pair of layers applied to said second layer, each of said pair comprising a first, additional layer selected from the group: an organic layer, and an inorganic layer, applied atop said second layer, and a second, additional layer selected from a non-selected material of said first, additional layer, said second, additional layer being applied to said first, additional layer, a first of said at least one additional pair of layers being applied to said second layer, subsequent ones of said at least one additional pair of layers being applied to a previous one thereof,
   wherein at least one of said under-layer said second layer, said first additional layer and said second additional layer comprises a well-ordered array of molecules serving as a template layer,
   wherein at least one of said under-layer, said second layer, said first additional layer and said second additional layer, comprises a thermally-resistant polymer selected from the group: epoxy, and phosphorus-based polyimides, and a portion of the electronic hardware and MEMS system substrates being uncovered by any thermally-resistant polymer.

21. The multi-layered coating for electronic hardware and MEMS system substrates as recited in claim 20, wherein at least one of said under-layer, said second layer, said first additional layer and said second additional layer, comprises an inorganic layer comprising an oxide selected from the group: $ZrO_2$, yttrium stabilized zirconia (YSZ), $SiO_2$, $Al_2O_3$, AlMgO, NiFeO, indium oxide, tin oxide, indium tin oxide, YBaCuO, BiSrCaCuO, LaSrMnO, NiO, CuO, FeAlO, aluminum nitride, TiN, BN, $Si_3N_4$, FeAlN, and combinations thereof.

22. The multi-layered coating for electronic hardware and MEMS system substrates as recited in claim 20, wherein said thermally-resistant polymer is polymerized in situ.

23. The multi-layered coating for electronic hardware and MEMS system substrates as recited in claim 20, wherein at least one of said under-layer, said second layer, said first additional layer and said second additional layer, comprises an organic layer comprising at least one selected from the group: a self-assembling monolayer (SAM) comprising molecules having a chain length of at least two, and a phosphonate self-assembling monolayer.

24. The multi-layered coating for electronic hardware and MEMS system substrates as recited in claim 20, wherein at least one of said under-layer, said second layer, said first additional layer and said second additional layer, is selectively applied, wherein at least one inorganic layer is selectively applied to only a portion of the substrate, leaving another portion of the substrate uncovered by the inorganic layer.

25. The multi-layered coating for electronic hardware and MEMS system substrates as recited in claim 20, wherein said under-layer is removable after application of at least said second layer.

26. A multi-layered coating for electronic hardware and MEMS system substrates, comprising:
   a) an under-layer selected from the group: an oxide layer, and a thermally-resistant polymer layer applied to a substrate selected from the group: electronic hardware, and a MEMS substrate;
   b) a first organic layer comprising at least one selected from the group: a self-assembling monolayer (SAM) comprising molecules having a chain length of at least two applied to said under-layer, and a phosphonate self-assembling monolayer; and
   c) at least one additional pair of layers, each of said additional pair of layers comprising a layer selected from the group: an oxide layer, and a thermally-resistant polymer layer, and a second organic layer comprising at least one selected from the group: a self-assembling monolayer (SAM) comprising molecules having a chain length of at least two, and a phosphonate self-assembling monolayer, applied to said inorganic layer, a first of said at least one additional pair of layers being applied to said first organic layer, subsequent ones of said at least one additional pair of layers being applied to a previous one thereof,
   wherein at least a portion of the substrate remains exposed through an opening in the at least the oxide layer.

27. The multi-layered coating for electronic hardware and MEMS system substrates as recited in claim 26, wherein at least one of said inorganic under-layer and said inorganic layer of said at least one additional pair of layers comprises an oxide layer selected from the group consisting of one or more of: $ZrO_2$, yttrium stabilized zirconia (YSZ), $SiO_2$, $Al_2O_3$, AlMgO, NiFeO, indium oxide, tin oxide, indium tin oxide, YBaCuO, BiSrCaCuO, LaSrMnO, NiO, CuO, and FeAlO.

28. The multi-layered coating for electronic hardware and MEMS system substrates as recited in claim 26, wherein said thermally-resistant polymer is polymerized in situ.

29. The multi-layered coating for electronic hardware and MEMS system substrates as recited in claim 26, wherein said under-layer is selectively applied resulting in layer coverage of only a predetermined area.

30. The multi-layered coating for electronic hardware and MEMS system substrates as recited in claim 26, wherein said under-layer is removable after application of at least said first organic layer.

31. The multi-layered coating for electronic hardware and MEMS system substrates as recited in claim 26, further comprising:
   d) an additional layer selected from the group: an inorganic layer, and a thermally-resistant polymer layer disposed between said first organic layer and a first one of said at least one additional pair of layers.

32. The multi-layered coating for electronic hardware and MEMS system substrates as recited in claim 31, wherein said additional layer comprises a material selected from the group consisting of an oxide layer selected from the group: $ZrO_2$, yttrium stabilized zirconia (YSZ), $SiO_2$, $Al_2O_3$, AlMgO, NiFeO, indium oxide, tin oxide, indium tin oxide, YBaCuO, BiSrCaCuO, LaSrMnO, NiO, CuO, FeAlO, aluminum nitride TiN, BN, $Si_3N_4$, FeAlN, and combinations thereof.

33. The multi-layered coating for electronic hardware and MEMS system substrates as recited in claim 31, wherein said additional layer comprises a thermally-resistant polymer selected from the group: epoxy, and phosphorus-based polyimides.

34. A multi-layered coating for electronic hardware and MEMS system substrates, comprising:
   a) an organic under-layer comprising at least one selected from the group: a self-assembling monolayer (SAM) comprising molecules having a chain length of at least two and a phosphonate self-assembling monolayer, applied to a substrate selected from the group: electronic hardware, and a MEMS substrate;
   b) a first layer selected from the group: an oxide layer, and a thermally-resistant polymer layer applied to said organic under-layer; and
   c) at least one additional pair of layers, each of said additional pairs of layers comprising at least one selected from the group: an organic layer comprising a self-assembling monolayer (SAM) comprising molecules having a chain length of at least two, and a phosphonate self-assembling monolayer, and a second layer selected from the group: an oxide layer, and a thermally-resistant polymer layer applied to said organic layer, a first of said at least one additional pair of layers being applied to said first layer, subsequent ones of said at least one additional pair of layers being applied to a previous one thereof,
   wherein a portion of the substrate is not covered by the first layer.

35. The multi-layered coating for electronic hardware and MEMS system substrates as recited in claim 34, wherein at least one of said first layer and said second layer comprises a material selected from the group consisting of: $ZrO_2$, yttrium stabilized zirconia (YSZ), $SiO_2$, $Al_2O_3$, AlMgO, NiFeO, InO, SnO, InSnO, YBaCuO, BiSrCaCuO, LaSrMnO, NiO, CuO, FeAlO, AlN, TiN, BN, $Si_3N_4$, FeAlN, and combinations thereof.

36. The multi-layered coating for electronic hardware and MEMS system substrates as recited in claim 34, wherein said thermally-resistant polymer is polymerized in situ.

37. The multi-layered coating for electronic hardware and MEMS system substrates as recited in claim 34, wherein said organic under-layer is selectively applied resulting in layer coverage of only a selected area and wherein at least a portion of the substrate is exposed through the multilayered coating.

38. The bi-layered coating for electronic hardware and MEMS system substrates as recited in claim 34, wherein said organic under-layer is removable after application of said first layer.

39. The multi-layered coating for electronic hardware and MEMS system substrates as recited in claim 34, further comprising:
   d) an additional organic layer comprising at least one selected from the group: a self-assembling monolayer (SAM) comprising molecules having a chain length of at least two, and a phosphonate self-assembling monolayer, disposed between said first layer and a first one of said at least one additional pair of layers.

* * * * *